US008466722B2

(12) United States Patent
Kossel et al.

(10) Patent No.: US 8,466,722 B2
(45) Date of Patent: Jun. 18, 2013

(54) STARTUP AND PROTECTION CIRCUITRY FOR THIN OXIDE OUTPUT STAGE

(75) Inventors: Marcel A. Kossel, Rueschlikon (CH); Daihyun Lim, Hopewell Junction, NY (US); Christian I. Menolfi, Rueschlikon (CH); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/284,265

(22) Filed: Oct. 28, 2011

(65) Prior Publication Data

US 2013/0106474 A1    May 2, 2013

(51) Int. Cl.
*H03L 7/00*    (2006.01)
(52) U.S. Cl.
USPC ........................................ 327/143; 327/142
(58) Field of Classification Search
USPC ................. 327/142, 143, 378, 530; 361/88, 361/90, 91.1
See application file for complete search history.

(56) References Cited

U.S. PATENT DOCUMENTS

| | | | | |
|---|---|---|---|---|
| 5,296,757 A * | 3/1994 | Koizumi | ........................... | 326/21 |
| 6,130,563 A * | 10/2000 | Pilling et al. | ................... | 327/111 |
| 6,335,637 B1 | 1/2002 | Correale et al. | | |
| 6,388,469 B1 | 5/2002 | Hunt et al. | | |
| 6,597,222 B2 | 7/2003 | Le et al. | | |
| 6,735,142 B1 | 5/2004 | Oh | | |
| 6,836,148 B2 * | 12/2004 | Pullen et al. | ..................... | 326/81 |
| 7,154,309 B1 | 12/2006 | Talbot et al. | | |
| 7,295,040 B1 | 11/2007 | Nguyen et al. | | |
| 7,605,618 B2 | 10/2009 | Srinivas et al. | | |
| 7,656,718 B2 | 2/2010 | Jeong | | |
| 7,813,093 B2 | 10/2010 | Boyko et al. | | |
| 2002/0186047 A1 * | 12/2002 | Sterrantino | ...................... | 326/86 |
| 2007/0115041 A1 * | 5/2007 | Tachibana et al. | ............ | 327/333 |
| 2007/0159218 A1 | 7/2007 | Srinivas et al. | | |
| 2009/0315610 A1 * | 12/2009 | Han et al. | ....................... | 327/333 |
| 2011/0149456 A1 | 6/2011 | Xiao et al. | | |

OTHER PUBLICATIONS

N. Kim, et al., "Programmable and Automatically Adjustable On-Die Terminator for DDR3-SRAM Interface," IEEE 2003 Custom Integrated Circuits Conference; pp. 391-394.
M. Kossel, et al., "A T-Coil Enhanced 8.5 Gb/s High-Swing SST Transmitter in 65 nm Bulk CMOS with < -16 dB Return Loss Over 10 10 GHz Bandwidth,"; IEEE J. Solid-State Circuits, vol. 43, No. 12; pp. 2905-2920; Dec. 2008.
N. Kurd, et al., "A Family of 32 nm IA Processors,"; IEEE Journal of Solid-State Circuits, vol. 46, No. 1.; Jan. 2011; pp. 119-130.
C. Menolfi, et al., "A 14Gb/s High-Swing Thin-Oxide Device SST TX in 45nm CMOS SOI," 2011 IEEE International Solid-State Circuits Conference; ISSCC Dig. Tech. Papers; Feb. 2011; pp. 156-158.

* cited by examiner

*Primary Examiner* — Lincoln Donovan
*Assistant Examiner* — Jung H Kim
(74) *Attorney, Agent, or Firm* — Cantor Colburn LLP; Daniel Morris

(57) ABSTRACT

A method for startup and operation of an output stage of a transmitter, the output stage comprising a first protection field effect transistor (FET) and a second protection FET includes enabling a startup circuit; providing a first bias voltage to the first protection FET in the output stage and a second bias voltage to the second protection FET stage in the output stage by the startup circuit; disabling the startup circuit and enabling a protection voltage generator; providing the first bias voltage to the first protection FET in the output stage by the protection voltage generator; and providing the second bias voltage to the second protection FET in the output stage by a second bias voltage power supply.

16 Claims, 8 Drawing Sheets

STARTUP AND PROTECTION CIRCUITRY FOR THIN OXIDE OUTPUT STAGE

BACKGROUND

This disclosure relates generally to the field of output stages for input/output (IO) drivers for electronic communications, and more particularly to startup and protection circuitry for a thin oxide output stage.

An output stage is an electronic device that generates electronic communications for transmission over a transmission medium, which may be part of any type of computing network. An output stage may be part of a chip or integrated circuit (IC) and may communicate with other chips internal to a computer, or may communicate over an external network such as an optical network. An output stage typically comprises a plurality of field effect transistors (FETs). Thick oxide FETs have typically been used in output stages, as thick oxide FETs may operate over a wide range of voltages without experiencing oxide breakdown. However, thick oxide FETs have relatively high parasitics, resulting in relatively high power consumption for a thick oxide output stage.

An output stage including thin oxide FETs may be used to reduce parasitics and power consumption. However, thin oxide FETs experience oxide breakdown at lower voltages than thick oxide FETs. In some computing systems, the supply voltages are higher than the gate-oxide breakdown limit of the thin oxide FETs in the output stage. Typically, a thin oxide FET may experience a maximum voltage of about 1.1 volts (V) before oxide breakdown occurs. Double data rate (DDR) signaling uses direct current (DC) supply voltages that are higher than the gate oxide breakdown limit of the thin oxide FETs, up to about 1.5V. Additional stacked protection transistors may be used to protect a thin oxide output stage in a DDR system; however, these additional protection transistors increase the complexity of the output stage because the protection devices need additional bias voltages. The power supplies that provide the additional bias voltages may require power sequencing, which is a relatively complex process, at startup or shutdown to avoid subjecting the thin oxide FETs in the output stage to voltages higher than their oxide breakdown voltage.

In a self-contained DDR signaling system, bias voltages need to be generated internally and cannot be provided by additional pins, as DDR systems are typically pin and area limited. Also, because DDR signaling uses a bidirectional link, there is some additional functionality such as on-die-termination (ODT) that make the protection biasing scheme even more demanding. Any power sequencing of the different DC supplies in the system (e.g., VDD for digital logic, VIO for unregulated building blocks, VCCD for regulated building blocks such as the clock path, and VDDR for the output stage) and the internal bias voltages for the thin oxide protection devices are undesired due to cost saving and reliability reasons.

BRIEF SUMMARY

In one aspect, a method for startup and operation of an output stage of a transmitter, the output stage comprising a first protection field effect transistor (FET) and a second protection FET, includes enabling a startup circuit; providing a first bias voltage to the first protection FET in the output stage and a second bias voltage to the second protection FET stage in the output stage by the startup circuit; disabling the startup circuit and enabling a protection voltage generator; providing the first bias voltage to the first protection FET in the output stage by the protection voltage generator; and providing the second bias voltage to the second protection FET in the output stage by a second bias voltage power supply.

In another aspect, a startup and protection system for an output stage of a transmitter, the output stage comprising a first protection field effect transistor (FET) and a second protection FET includes a startup circuit configured to provide a first bias voltage to the first protection FET and a second bias voltage to the second protection FET until the startup circuit is disabled; a protection voltage generator configured to provide the first bias voltage to the first protection FET after the startup circuit is disabled; and a second bias voltage power supply configured to provide the second bias voltage to the second protection FET after the startup circuit is disabled.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of startup and protection circuitry for a thin oxide output stage, and a method of operating startup and protection circuitry for a thin oxide output stage, are provided, with exemplary embodiments being discussed below in detail. The startup circuitry includes a self-biasing voltage divider that provides bias voltages to pull-up and pull-down branches of the output stage at safe levels during startup, and avoids the need for power sequencing during startup of the output stage. The protection voltage generator ($V_{prot}$ generator) includes a capacitive voltage divider that generates the bias voltage for the pull-up branch of the output stage within a safe range for thin oxide device protection during regular operation of the output stage after the startup circuit is disabled.

Figure 1:
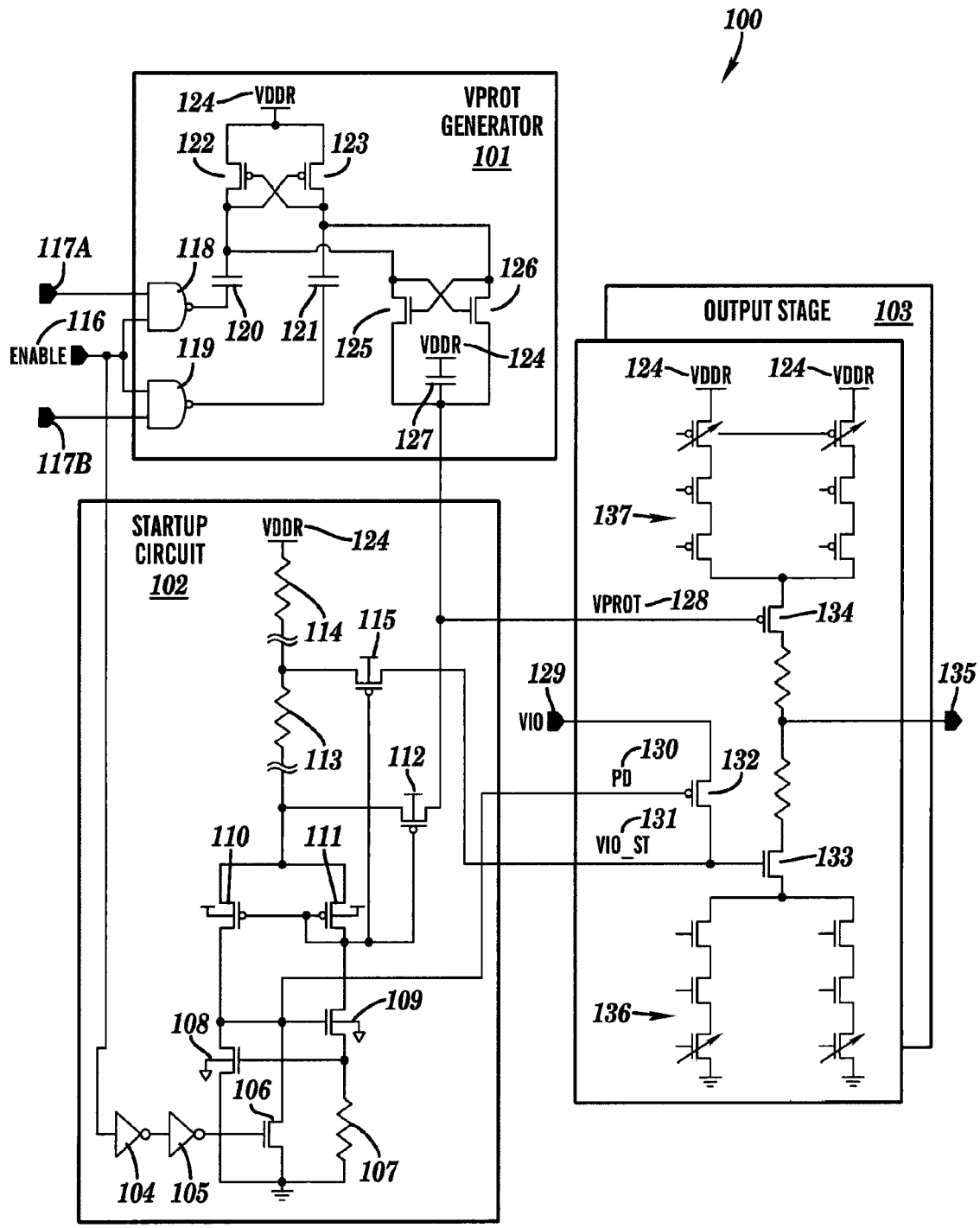
FIG. 1 illustrates an embodiment of a system including a $V_{prot}$ generator, startup circuit, and a thin oxide output stage.

FIG. 1 illustrates an embodiment of a system 100 including a $V_{prot}$ generator 101, startup circuit 102, and a thin oxide output stage 103. The output stage 103 operates with two power supplies, VIO 129 and VDDR 124. In some embodiments, VIO 129 may be about 1 volt (V), and VDDR 124 may be about up to about 1.5V. The output stage 103 includes a pull-down branch 136 and a pull-up branch 137, which are each comprised of a plurality of thin oxide FETs. The output stage 103 also includes two thin oxide protection FETs 133 and 134. The pull up branch 137 is connected between protection p-type FET (pFET) 134 and VDDR 124, and the pull down branch 136 is connected between protection n-type FET (nFET) 133 and ground. Protection pFET 134 receives $V_{prot}$ 128 as a gate voltage, and protection nFET 133 receives either VIO_ST 131 (i.e., VIO startup, which is supplied by the startup circuit 102 during startup) or VIO 129 (supplied by a VIO power supply during normal operation) as a gate voltage. To have equal overdrive voltages in the output stage 103, the pull-up branch 137 is operated in the same way as the pull-down branch 136 but with a voltage shift of VDDR-VIO. Electronic communications are generated on signal output 135. An output stage such as output stage 103 may be included in any appropriate device that generates electronic communications for transmission over a transmission medium.

To prevent any gate-oxide breakdown of the FETs in the output stage 103, it is important that the gate bias voltages of the protection pFET 134 and the protection nFET 133 assume valid values in all operation modes. The gate bias voltage of protection pFET 134 is $V_{prot}$ 128, which is equal to VDDR 124 minus VIO 129, and the gate voltage of the protection nFET 133 is VIO 129. Therefore, the voltage differences VDDR-VIO (=high-side supply) and VIO-GND (=low-side supply) must be below about the voltage at which thin oxide breakdown typically occurs, which may be about 1.1 V. VIO is typically about 1.0V, which is typically below the thin oxide breakdown voltage. However, at startup, before VIO 129 ramps up, $V_{prot}$ 128 would be approximately equal to VDDR 124 in the absence of the startup circuit 102, which is higher than the typical oxide breakdown voltage of a thin oxide FET. Hence, the startup circuit 102 is provided to protect the output stage 103 from exposure to higher voltages during startup, and the $V_{prot}$ generator 101 provides $V_{prot}$ 128 within a safe range during regular operation.

The $V_{prot}$ generator 101 comprises a capacitive voltage divider including cross-coupled pFETs 122 and 123, capacitors 120-121, cross-coupled nFETs 125-126, and storage capacitor 127. While storage capacitor 127 is shown referenced to VDDR 124 in FIG. 1, in other embodiments, the storage capacitor 127 may be ground referenced depending on the type of capacitor chosen for storage capacitor 127, in order to improve the capacitance per unit area of the storage capacitor 127. The startup circuit 102 includes a self-biasing circuit comprising FETs 108-111 and resistor 107; the self-biasing circuit defines a voltage divider together with resistors 113-114. The $V_{prot}$ generator 101 provides $V_{prot}$ 128 to the output stage 103 during operation, while the startup circuit 102 provides $V_{prot}$ 128 and VIO_ST 131 to the output stage 103 at startup, such that no power sequencing of the power supplies is needed to prevent oxide breakdown of the thin-oxide FETs that comprise output stage 103. The startup circuit 102 senses the level of VDDR 124 and provides appropriate bias voltages to the protection FETs 133 and 134. Enabling and disabling of $V_{prot}$ generator 101 and startup circuit 102 are controlled by an enable signal 116. The enable signal may be tied to VIO 129, such that the startup circuit 102 is enabled when VIO 129 is low, and the $V_{prot}$ generator 101 is enabled when VIO 129 is high.

Figure 2:
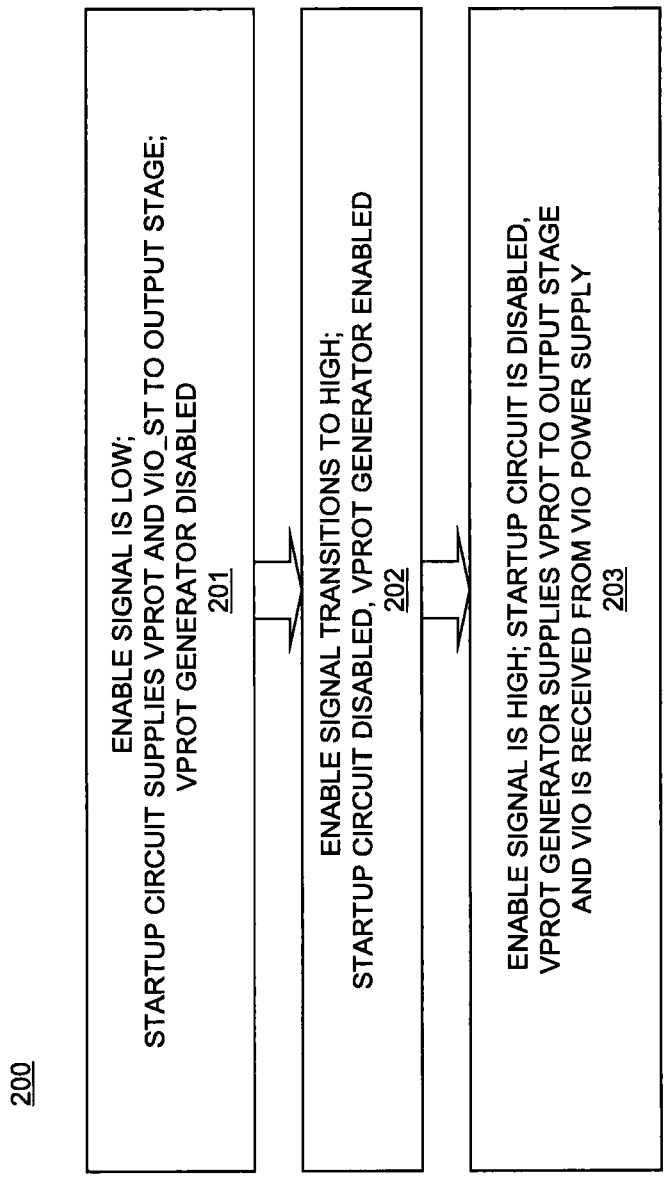
FIG. 2 illustrates a flowchart of an embodiment of a method of operating the system of FIG. 1.

A flowchart of a method 200 of the functioning of the system 100 including $V_{prot}$ generator 101, startup circuit 102, and thin oxide output stage 103 is shown in FIG. 2. First, in block 201 of method 200, during startup of the system 100, enable signal 116 is low. While the enable signal is low, the startup circuit 102 supplies $V_{prot}$ 128 and VIO_ST 131 the output stage 103, and $V_{prot}$ generator 101 is disabled. The details of the operation of the startup circuit 102 during block 201 are discussed below with respect to FIG. 3. Then, flow of method 200 proceeds to block 202, in which the enable signal 116 transitions from low to high, the startup circuit 102 is disabled, and the $V_{prot}$ generator 101 is enabled. The transition of enable signal 116 from low to high may be triggered ramping up of VIO 129. The outputs of the NAND gates 118 and 119 are both high while the enable signal 116 is low, hence the bottom plates of the capacitors 120/121 are both tied to the VIO supply because the NAND-gates 118 and 119 are powered by VIO. Therefore the differential clock 117A/117B may only pull-down the bottom plates of the capacitors 120/121 once the enable signal 116 transitions to high, enabling the $V_{prot}$ generator 101. The details of the operation of the startup circuit 102 during block 202 are discussed below with respect to FIG. 3. Lastly, in block 203 of method 200, the enable signal 116 is high, the startup circuit 102 is disabled, the $V_{prot}$ generator 101 supplies $V_{prot}$ 128 to the output stage 103, and VIO 129 is received by the output stage from the VIO power supply. Details of the operation of the $V_{prot}$ generator 101 during block 203 are discussed with respect to FIGS. 5A-B.

Figure 3:
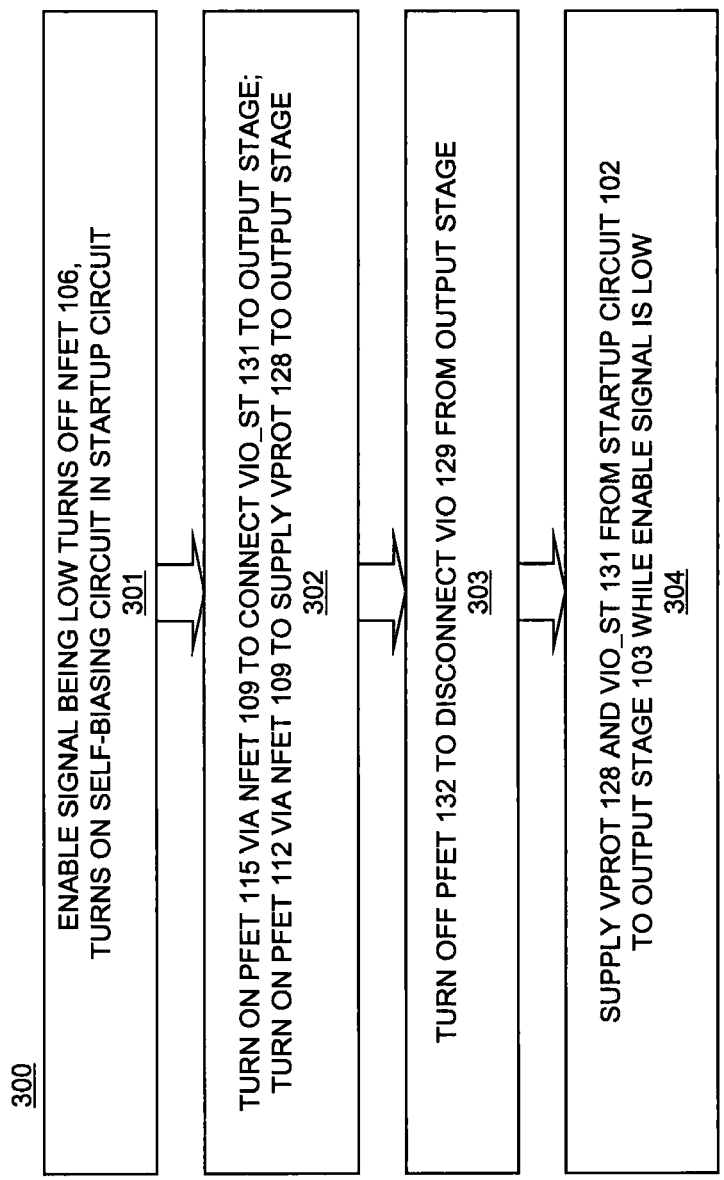
FIG. 3 illustrates a flowchart of a detailed embodiment of operation of the system of FIG. 1 during block 201 of FIG. 2.

Method 300 of FIG. 3 illustrates the details of the operation of the startup circuit 102 during block 201 of FIG. 2. First, in block 301, the enable signal 116 that is applied to the series inverters 104 and 105 is low, and consequently nFET 106 is switched off. The inverters 104 and 105 define a buffer that propagates the enable signal 116 to the gate of nFET 106. The self-biasing circuit comprising FETs 108-111 and resistor 107 defines a voltage divider together with resistors 113-114. The voltage divider comprising FETS 108-111 and resistors 107 and 113-114 turns on due to the turn off of nFET 106, and is tapped to generate, based on VDDR 124, an auxiliary VIO called VIO_ST 131 (i.e., VIO startup) and an initial $V_{prot}$ 128. Then, in block 302, FET 109 in the self-biasing circuit provides a gate voltage that turns on FETs 115 and 112. FET 115 provides VIO_ST 131 from the voltage divider to the output stage 103, and FET 112 provides $V_{prot}$ 128 from the voltage divider to the output stage 103. Then, in block 303, pFET 132 is switched off via PD signal 130 (i.e., power down signal), which is received from the mirrored branch of the current-mirror diode-connected FETs 108 and 109 to make sure that VIO_ST 131 does not power up the circuitry connected to the real VIO 129. Lastly, in block 304, the startup circuit 102 provides VIO_ST 131 and $V_{prot}$ 128 to the output stage 103 as long as the enable signal 116 stays low. VIO_ST 131 and $V_{prot}$ 128 are regulated by the startup circuit 102 as described above such that no FETs in output stage 103 experience a voltage exceeding the thin oxide breakdown voltage (about 1.1 V) during startup.

In some embodiments, series resistors 113-114 may be replaced with series diode-connected FETs, which can also be made programmable to adjust different voltage division ratios. In other embodiments, the series resistors 113-114 may be made programmable using switched resistor techniques. Since VIO_ST 131 and $V_{prot}$ 128 that are generated by the startup circuit 102 are a function of resistor division, making resistors 113-114 programmable provides the ability to adjust VIO_ST 131 and $V_{prot}$ 128 for appropriate protection of output stage 103. Programmable digital bits can be used for resistor value selections in some embodiments.

There is no contention between the $V_{prot}$ generator 101 and startup circuit 102 during method 300 of FIG. 3, because the NAND gates 118 and 119 in the $V_{prot}$ generator 101 are powered by VIO supply 129 (=>Logical 1 means VIO, logical 0 means ground potential). During startup mode in block 201, the influence of $V_{prot}$ generator 101 on $V_{prot}$ 128 is isolated, so that $V_{prot}$ 128 is supplied to the output stage 103 by the startup circuit 102 via FET 112 without contention. There are two scenarios that may occur during method 300 of FIG. 3 (i.e., block 201 of FIG. 2). In the first scenario, VDDR 124 is powered up before VIO 129 is powered up, and enable signal 116 is low. In the second scenario, VDDR 124 and VIO 129 are both powered up, and the enable signal 116 is low. In the first scenario, because the enable signal 116 is low, the NAND gates 118 and 119 in the $V_{prot}$ generator 101 are not powered, and hence the output of the NAND gate is floating at a low potential. In the second scenario, The NAND gate outputs are high, i.e., equal to VIO 129, and the bottom plate potentials of capacitors 120 and 121 are referenced at potential VIO. In both scenarios, the top plates of capacitors 120 and 121 are connected to the drains of pFETs 122 and 123, respectively, that are turned off as a starting point. Typically one of the cross-coupled pFETs 122 or 123 would turn on based on the floating gate potentials. If the gate/source voltage ($V_{gs}$) of one of the pFETs 122/123 is just over its threshold to turn it on, the drain of pFET (122 or 123) goes towards VDDR 124, which in turn starts to turn the other pFET (123 or 122). This would be the state it will remain at until VIO 129 is powered up. A high drain of a pFET 122/123 turns on an nFET 126/125, while the other nFET 125/126 is off due to the low floating potential at its gate. Thus capacitor 127 is charged to a floating potential through nFET 126/125. Therefore, the stronger potential coming from the startup circuit 102 via FET 112 would override the output of the nFET 126/125 to charge storage capacitor 127 instead, and be signal $V_{prot}$ 128.

Figure 4:
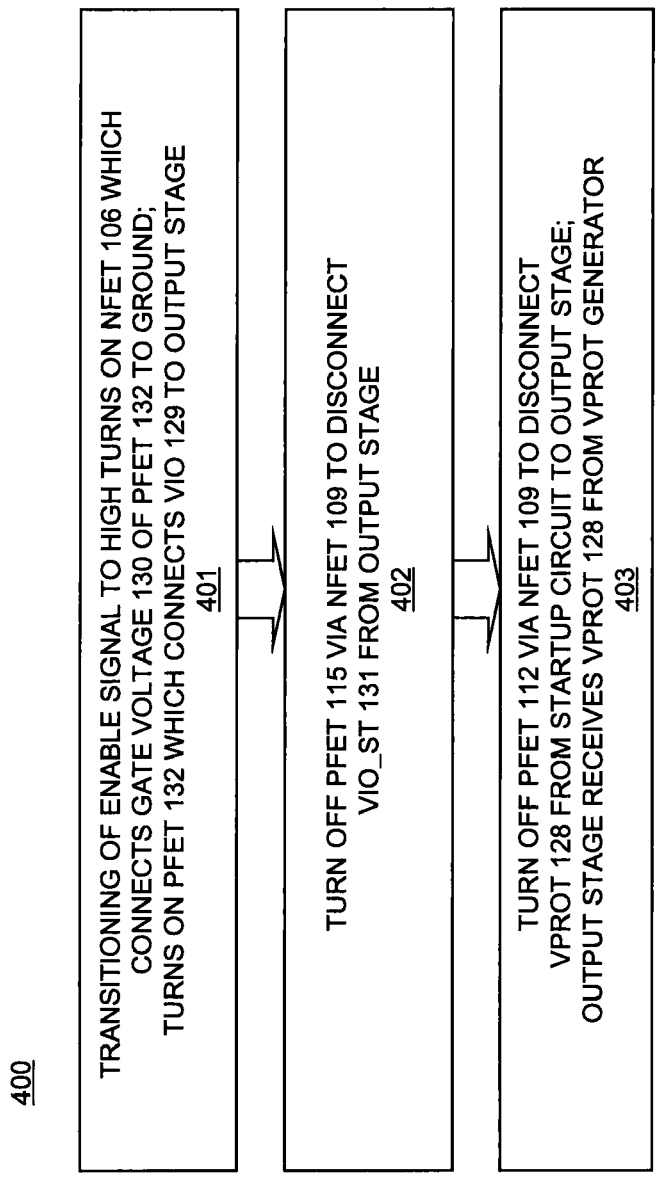
FIG. 4 illustrates a flowchart of a detailed embodiment of operation of the system of FIG. 1 during block 202 of FIG. 2.

After VIO 129 is powered up and provides the correct DC supply voltage (i.e., approximately 1.0V), enable signal 116 transitions to high and the startup circuit 102 is disabled. In some embodiments, enable signal 116 may be directly connected to VIO 129; in other embodiments, enable signal 116 may be generated separately from VIO 129. Turning to method 400 of FIG. 4, details of the operation of the startup circuit 102 during block 202 of FIG. 2 are illustrated. First, in block 401, when enable signal 116 transitions from low to high, the nFET 106 is turned on, which pulls down both PD signal 130 and the gate of nFET 109. Because PD 130 is low, pFET 132 is turned on. In block 402, the gate voltage of nFET 109 is tied to ground by the turned on nFET 106, so that nFET 109 turns off. Because nFET 109 is turned off, pFET 115 also turns off, VIO 129 overrides VIO_ST 131 via turned on pFET 132, and VIO_ST 131 becomes floating. The upper part of the voltage divider including resistors 113-114 and pFETs 110 and 111 is pulled up to VDDR 124 and the lower part including nFETs 108 and 109 is pulled down to ground. Then, in block 403, pFET 112 also switches off due to the turn off of nFET 109, such that $V_{prot}$ 128 is provided to the output stage 103 by the $V_{prot}$ generator 101 instead of by the startup circuit 102.

During operation of output stage 103, the $V_{prot}$ generator 101 maintains $V_{prot}$ 128 such that $V_{prot}$ 128 is equal to the difference between VDDR 124 and VIO 129, and provides $V_{prot}$ 128 to the output stage 103. When the enable signal 116 transitions from low to high, differential clock 117A-B turns on, and the enable signal 116 and the differential clock 117A-B together enable the $V_{prot}$ generator 101. The differential clock 117A-B alternately pulls down the top plate potential of each of the level translator capacitors 120 and 121 via NAND gates 118-119, and also alternately turns cross-coupled pFETs 122 and 123 on and off. The $V_{prot}$ generator 101 comprises a two-legged capacitive voltage divider. The first leg of the capacitive voltage divider comprises capacitor 120, pFET 122, and nFET 125, and the second leg comprises capacitor 121, pFET 123, and nFET 126. The capacitive voltage division is mainly given by the ratio $Cp/(Cp+C0)$, where Cp is the parasitic capacitance of one of the pFETs 122/123 in the off state and C0 is the capacitance of one of the capacitors 120/121. This capacitive voltage divider determines the low level of the level-shifted signal.

Figure 5A:
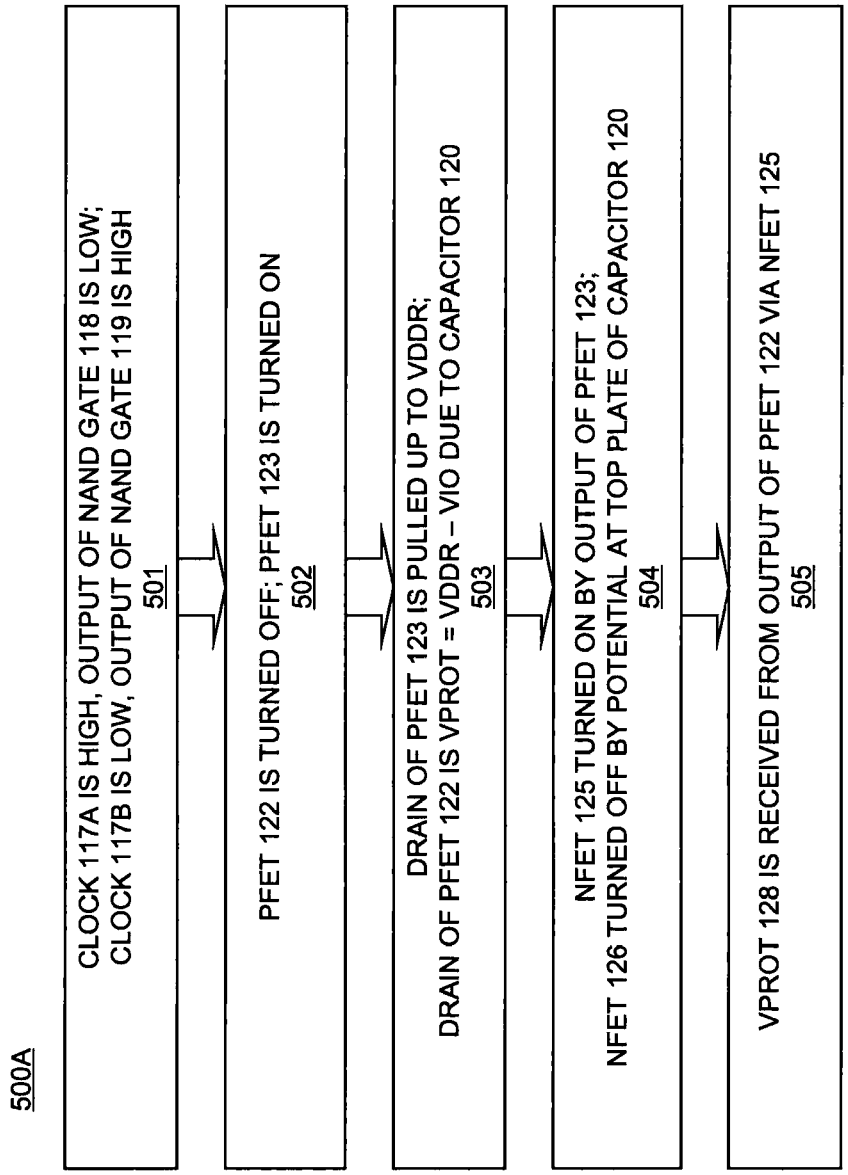
FIGS. 5A-B illustrate a flowchart of a detailed embodiment of operation of the system of FIG. 1 during block 203 of FIG. 2.

Details of the operation of the $V_{prot}$ generator 101 during block 203 of FIG. 2 are discussed with reference to FIGS. 5A-B. FIG. 5A describes the situation in which clock signal 117A is high and clock 117B is low, triggering the first leg of the capacitive voltage divider, and FIG. 5B describes the situation in which clock signal 117A is low and clock 117B is high, triggering the second leg of the capacitive voltage divider. First, in block 501, the clock signal 117A being high sets the output of NAND gate 118 to low, and the clock signal 117B being set to low sets the output of NAND gate 119 to high. Then, in block 502, pFET 122 is turned off by the output of NAND gate 119 (which is driving up the right hand side leg), and pFET 123 is turned on by the output of NAND gate 118 (which is driving down the left hand side leg). Then, in block 503, the drain of pFET 123 is pulled up to VDDR 124. The top plate potential of level translator capacitor 120 is pulled down by the output of NAND gate 118, which causes the voltage at the drain of pFET 122 to be VDDR-VIO, which gives $V_{prot}$ (discussed in further detail below with respect to EQ. 1). Then, in block 504, nFET 125 is turned on by the drain of pFET 123, and nFET 126 is turned off by the low value of the top plate potential of capacitor 120. Then, in block 505, $V_{prot}$ 128 is received by the output stage 103 via turned-on nFET 125 from the drain of pFET 122.

Figure 5B:
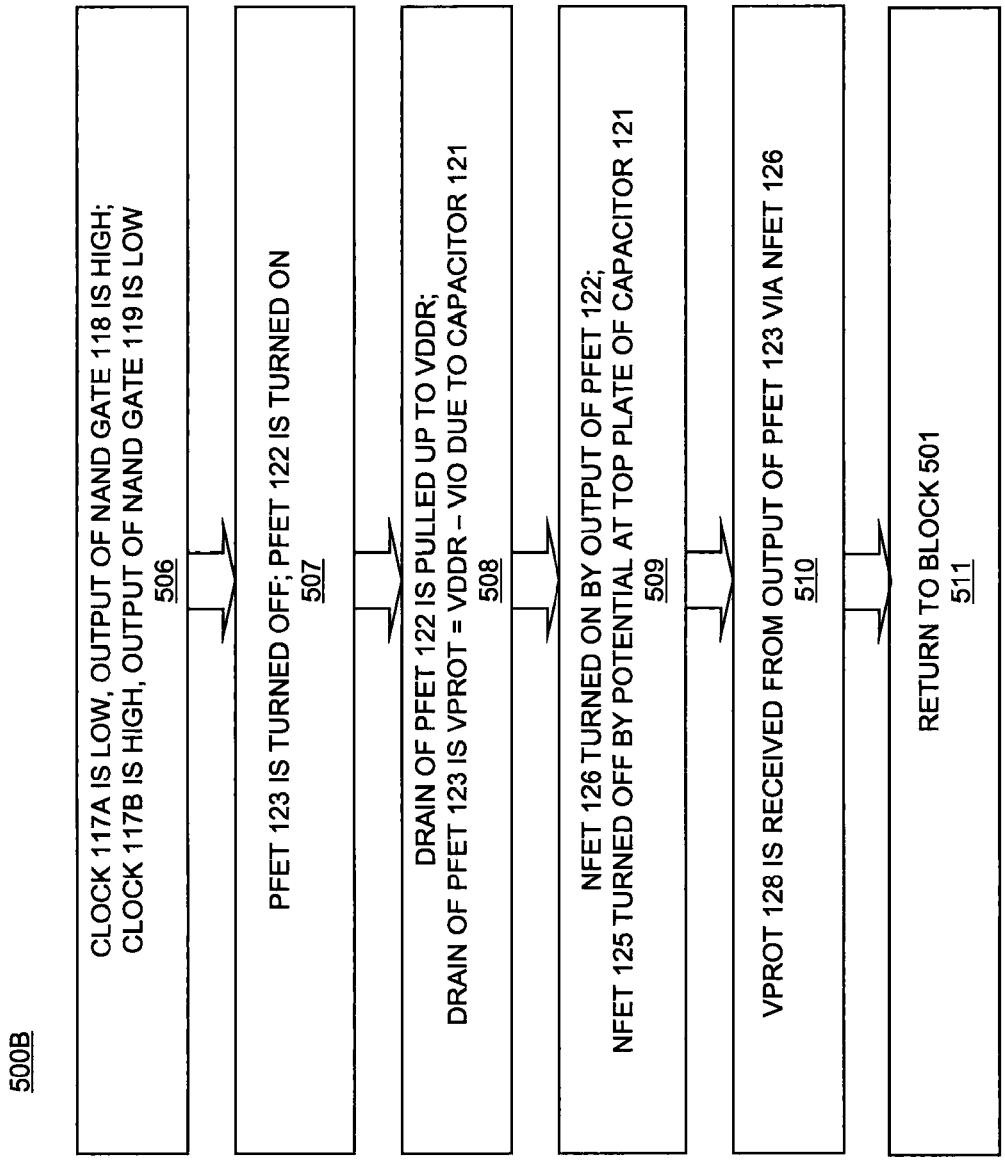

Flow then proceeds to block 506 of FIG. 5B. First, in block 506, the clock signal 117B is high, which sets the output of NAND gate 119 to low, while the clock signal 117A is set to low, which sets the output of NAND gate 118 to high. Then, in block 507, pFET 122 is turned on by the pulling down output of NAND gate 119, and pFET 123 is turned off by the pulling up output of NAND gate 118. Then, in block 508, the output of pFET 122 is pulled up to VDDR 124. The top plate potential of level translator capacitor 121 is pulled down by the output of NAND gate 119, which causes the voltage at the output of pFET 123 to be VDDR-VIO, which gives $V_{prot}$ (also discussed in further detail below with respect to EQ. 1). Then, in block 509, nFET 126 is turned on by the drain of pFET 122, and nFET 125 is turned off by the low value of the top plate potential of capacitor 121. Then, in block 510, $V_{prot}$ 128 is received by the output stage 103 via turned-on nFET 126 from the drain of pFET 123. Lastly, in block 511, flow returns to block 501 of FIG. 5A.

The interaction of the level translator capacitors 120/121 and the storage capacitor 127 is discussed below. Owing to capacitive voltage division, the top plate of the pulled down level translator capacitor 120/121 assumes the desired voltage $V_{prot}$ in blocks 503/508 of FIGS. 5A-B, which is then fed via the cross-coupled nFETs 125/126 to the output storage capacitor 127 that holds $V_{prot}$. NFETs 125 and 126 work in a complementary manner with respect to the cross-coupled pFETs 122 and 123, which means that nFET 125 is turned on only if pFET 122 is switched off, and nFET 126 is turned on only if pFET 123 is switched off This assures that storage capacitor 127 is being updated alternately by each of the two capacitive voltage divider legs in the $V_{prot}$ generator 101. The charge refreshing is received from the NAND gates 118/119 since the storage capacitor 127 is tied to VDDR and potential leakage will pull up the $V_{prot}$ potential. The storage capacitor 127 is shown as tied to VDDR 124 in FIG. 1 because the capacitance of storage capacitor 127 is dependent on the bias voltage; the capacitance per area ratio may be larger in the pull up configuration than if the storage capacitor 127 was connected to ground in some embodiments. Once storage capacitor 127 is fully charged to $V_{prot}$, the switched capacitive voltage divider only needs to replace the charge leakage of storage capacitor 127.

The two legs of the capacitive voltage divider are each comprised of the series-connection of the pulled up capacitor (i.e., the capacitance of pFET 122/123 in the off state and the load capacitance) and its respective associated clock level translator capacitor 120/121 (also referred to as fly-caps). For the first leg of the capacitive voltage divider comprising capacitor 120, pFET 122, and nFET 125, neglecting charge leakage, $V_{prot}$ 128 is given by:

$$V_{prot}=VDDR*(C_{up})/(C_{120}+C_{up}), \quad (EQ. 1)$$

where $C_{120}$ is the capacitance of level translator capacitor 120, $C_{up}$ is equal to $C_{122,off} \| C_{load}$, where $C_{122,off}$ is the offstate capacitance of pFET 122, and $C_{load}$ is the equivalent storage capacitance of capacitor 127 seen through the turned on nFET 125. The value of level translator capacitor 120 is chosen such that:

$$V_{prot}=VDDR-VIO+VMARGIN, \quad (EQ. 2)$$

where VMARGIN is a safety margin to prevent a thin oxide breakdown voltage violation if $V_{prot}$ has a superimposed ripple. VMARGIN may be about 50 mV in some embodiments. The second leg of the capacitive voltage divider comprising capacitor 121, pFET 123, and nFET 126 behaves identically to the first leg.

The relationships in EQs. 1 and 2 lead to some design tradeoffs. The smaller $C_{up}$ becomes, the smaller level translator capacitors 120 and 121 may be. The smaller pFETs 122/123 are chosen, the longer it takes to charge storage capacitor 127. On the other hand, charge leakage is reduced because it is dominated by the leakage through nFETs 125/126. If the only objective of storage capacitor 127 is to hold $V_{prot}$, storage capacitor 127 may be selected as small as possible. However, storage capacitor 127 also acts as decoupling capacitor for the charge feedthrough of the protection pFET 134 in the output stage 103, which produces ripples on storage capacitor 127. Therefore, to reduce the voltage ripples on the storage capacitor 127, the value of storage capacitor 127 is chosen large. This, however, contradicts the requirement of keeping $C_{up}$ small. Ripples may also be reduced by decreasing the size of the protection pFET 134 in the output stage 103 because the feedthrough charge depends on the gate capacitance of these protection pFET 134. Making the pFET 134 smaller, however, will reduce the impedance tuning range because more headroom is consumed by the protection devices, and may also lead to electromigration problems. For that reason, $V_{prot}$ 128 is only used for the gate biasing of the protection pFET 134 and explicitly not as a ground node for any logic between VDDR and $V_{prot}$.

Figure 6:
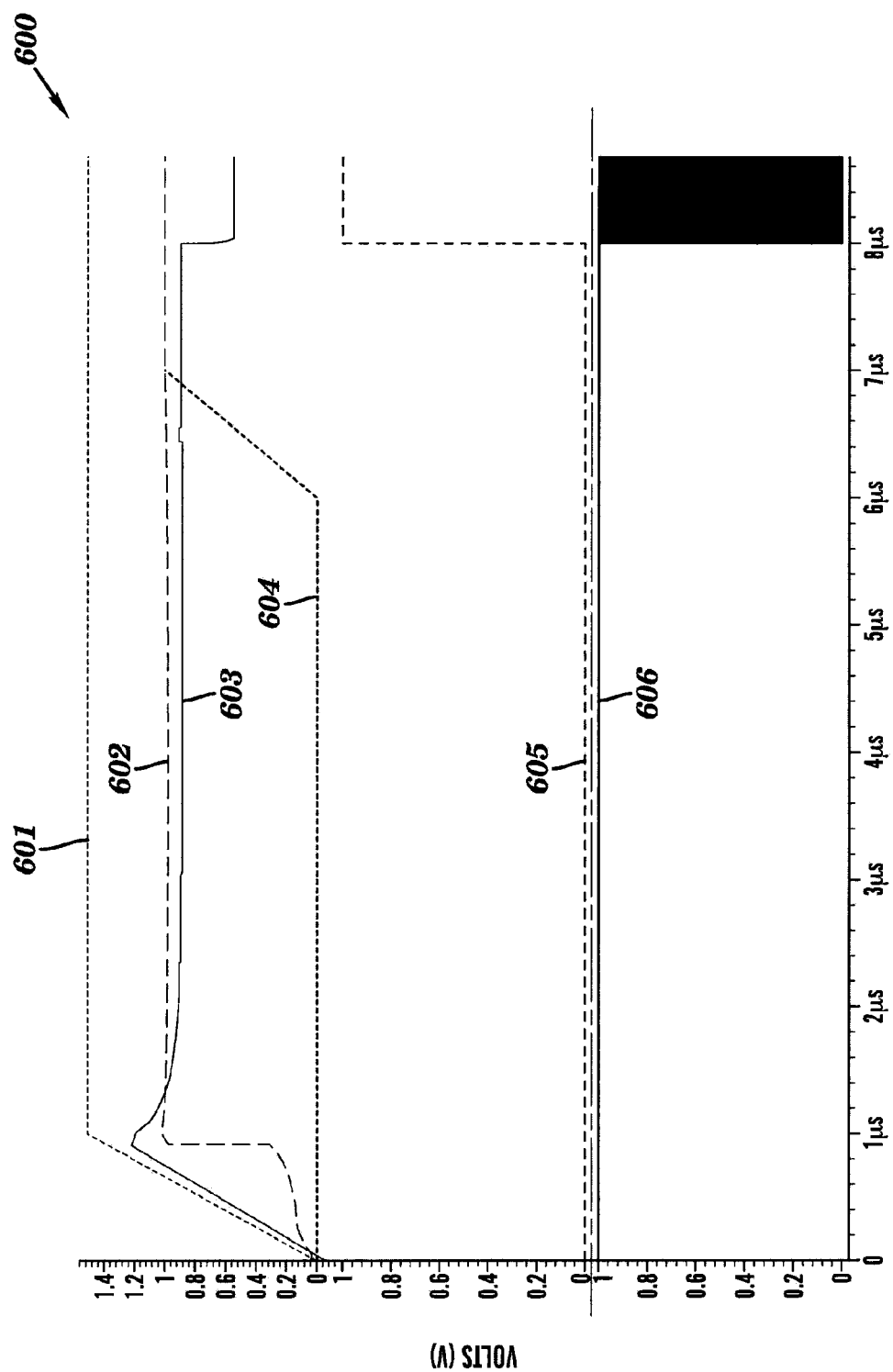
FIG. 6 is a graph illustrating the operation of an embodiment of a system including a $V_{prot}$ generator, startup circuit, and a thin oxide output stage.

FIG. 6 is a graph 600 illustrating the operation of an embodiment of a system including a $V_{prot}$ generator, startup circuit, and a thin oxide output stage, such as system 100 of FIG. 1. Graph 600 shows a VDDR signal 601, which corresponds to VDDR 124; a startup VIO signal 602, which corresponds to VIO_ST 131; a Vprot signal 603, which corresponds to Vprot 128, a VIO signal 604, which corresponds to VIO 129, an enable signal 605, which corresponds to enable signal 116, and a clock signal 606, which corresponds to clock signal 117A-B. In the graph 600, VDDR signal 601 is 1.5V and ramps up before VIO signal 604. VIO 604 is down during the first 6 microseconds (μs). Before 6 μs, the startup circuit 102 generates the startup VIO signal 602 (of about 1.0 V) and Vprot signal 603. After about 6 μs, VIO 604 ramps up and the enable signal 116 goes high so that the startup circuit shuts 102 down and the $V_{prot}$ generator 101 takes over generation of $V_{prot}$ 128. Also after about 6 μs, the pull-down protection of output stage 103 is directly provided by VIO signal 604 instead of the startup VIO signal 602 from the startup circuit 102. The Vprot signal 603 generated by the startup circuit 102 before about 6 μs about 800 mV, which is slightly higher than the $V_{prot}$ signal from the $V_{prot}$ generator 101. After 6 μs.

During power up, the startup circuit 102 only needs to protect the thin oxide pull-up branch 137 in output stage 103, whereas in the regular operation mode the $V_{prot}$ generator 101 not only generates the pull-up protection bias, but must also provide the same voltage overdrive as in the pull-down branch 136 (namely, VIO=VDDR−$V_{prot}$) for proper functioning of the output stage 103. Hence the accuracy requirement of the $V_{prot}$ generator 101 during regular operation is much higher than that of the startup circuit 102 because the $V_{prot}$ generator 101 needs to generate $V_{prot}$=VDDR−VIO relatively accurately. During startup, the $V_{prot}$ bias requirements are as follows: VDDR−VMAX<$V_{prot}$<VMAX, which is fulfilled in the current example with 0.4V<VMAX<1.1V.

Figure 7:
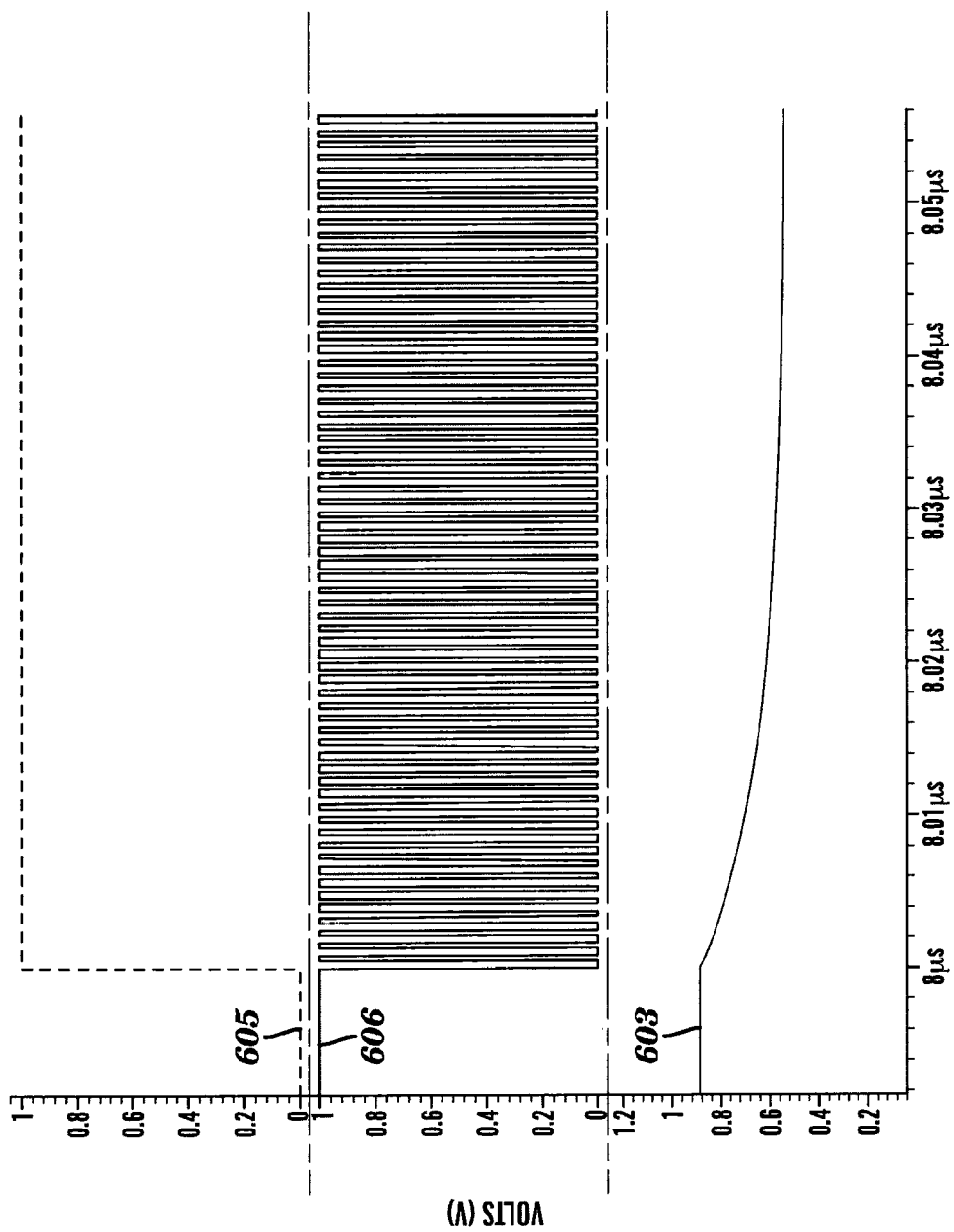
FIG. 7 is a graph illustrating the operation of an embodiment of a system including a $V_{prot}$ generator, startup circuit, and a thin oxide output stage.

FIG. 7 is a graph 700 illustrating the operation of an embodiment of a system including a $V_{prot}$ generator, startup circuit, and a thin oxide output stage, such as system 100 of FIG. 1. The low-to-high transition of the enable signal 605, switching of the clock signal 606, and the settling behavior of the $V_{prot}$ signal 603 generated by the $V_{prot}$ generator 101 after 7 μs, are shown in FIG. 7. The settling time is mainly given by the size of the storage capacitor 127, which in turn is sized such as to sufficiently suppress any voltage ripples produced by the charge feedthrough of the switching circuitries (e.g. level translators, driver output stage) that are connected to the $V_{prot}$ signal 603.

The technical effects and benefits of exemplary embodiments include protection of a thin oxide output stage without the need for power sequencing during startup, and relatively accurate generation of bias voltages for the thin oxide output stage during operation.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for startup and operation of an output stage of a transmitter, the output stage comprising a first protection field effect transistor (FET) and a second protection FET, the method comprising:
    enabling a startup circuit;
    providing a first bias voltage to the first protection FET in the output stage and a second bias voltage to the second protection FET in the output stage by the startup circuit;
    disabling the startup circuit and enabling a protection voltage generator;
    providing the first bias voltage to the first protection FET in the output stage by the protection voltage generator; and
    providing the second bias voltage to the second protection FET in the output stage by a second bias voltage power supply;
    wherein disabling the startup circuit and enabling the protection voltage generator comprises transitioning an enable signal from low to high, the enable signal being connected to both the startup circuit and the protection voltage generator, and further comprising differential clock connected to the protection voltage generator, wherein the differential clock is configured to turn on in the event the enable signal transitions from low to high.

2. The method of claim 1, wherein the first protection FET comprises a protection FET for a pull-up branch of the output stage, the pull-up branch being connected between the first protection FET and a third voltage, and wherein the second protection FET comprises a protection FET for a pull-down branch of the output stage, the pull-down branch of the output stage being connected between the second protection FET and ground.

3. The method of claim 2, wherein the first bias voltage received from the protection voltage generator is equal to the difference between the third voltage and the second bias voltage received from the power supply.

4. The method of claim 1, wherein the enable signal is configured to transition from low to high in the event the second bias voltage power supply transitions from low to high.

5. The method of claim 1, wherein the protection voltage generator comprises a capacitive voltage divider, the capacitive voltage divider comprising a first leg comprising a first p-type FET (pFET), a first capacitor, and a first n-type FET (nFET) in series, and a second leg comprising a second pFET, a second capacitor, and a second nFET in series, and wherein the differential clock alternately turns on the first leg while turning off the second leg, and then turns on the second leg while turning off the first leg, such that the first bias voltage is alternately provided to the output stage from the first leg and the second leg via a storage capacitor.

6. The method of claim 5, wherein the first pFET and the second pFET comprise cross-coupled pFETs, and wherein the first nFET and the second nFET comprise cross-coupled nFETs.

7. The method of claim 1, wherein the startup circuit comprises a self-biasing voltage divider.

8. The method of claim 1, wherein the startup circuit further comprises a second bias voltage supply FET configured to connect the second bias voltage power supply to the output stage in the event the startup circuit is disabled.

9. A startup and protection system for an output stage of a transmitter, the output stage comprising a first protection field effect transistor (FET) and a second protection FET, the system comprising:
    a startup circuit configured to provide a first bias voltage to the first protection FET and a second bias voltage to the second protection FET until the startup circuit is disabled;
    a protection voltage generator configured to provide the first bias voltage to the first protection FET after the startup circuit is disabled;
    a second bias voltage power supply configured to provide the second bias voltage to the second protection FET after the startup circuit is disabled;
    an enable signal connected to both the startup circuit and the protection voltage generator, wherein the startup circuit is disabled when the enable signal transitions from low to high; and
    a differential clock connected to the protection voltage generator, wherein the differential clock is configured to turn on in the event the enable signal transitions from low to high.

10. The system of claim 9, wherein the first protection FET comprises a protection FET for a pull-up branch of the output stage, the pull-up branch being connected between the first protection FET and a third voltage, and wherein the second protection FET comprises a protection FET for a pull-down branch of the output stage, the pull-down branch of the output stage being connected between the second protection FET and ground.

11. The system of claim 10, wherein the first bias voltage received from the protection voltage generator is equal to the difference between the third voltage and the second bias voltage received from the power supply.

12. The system of claim 9, wherein the enable signal is configured to transition from low to high in the event the second bias voltage power supply transitions from low to high.

13. The system of claim 9, wherein the protection voltage generator comprises a capacitive voltage divider, the capacitive voltage divider comprising a first leg comprising a first p-type FET (pFET), a first capacitor, and a first n-type FET (nFET) in series, and a second leg comprising a second pFET, a second capacitor, and a second nFET in series, and wherein the differential clock alternately turns on the first leg while turning off the second leg, and then turns on the second leg while turning off the first leg, such that the first bias voltage is alternately provided to the output stage from the first leg and the second leg via a storage capacitor.

14. The system of claim 13, wherein the first pFET and the second pFET comprise cross-coupled pFETs, and wherein the first nFET and the second nFET comprise cross-coupled nFETs.

15. The system of claim 9, wherein the startup circuit comprises a self-biasing voltage divider.

16. The system of claim 9, wherein the startup circuit further comprises a second bias voltage supply FET configured to connect the second bias voltage power supply to the output stage in the event the startup circuit is disabled.

* * * * *